United States Patent [19]
Saito et al.

[11] Patent Number: 5,049,980
[45] Date of Patent: Sep. 17, 1991

[54] ELECTRONIC CIRCUIT DEVICE AND METHOD OF MANUFACTURING SAME

[75] Inventors: Tamio Saito, Ome; Masayuki Ohuchi, Komae; Akira Niitsuma, Ohta, all of Japan

[73] Assignee: Kabushiki Kaisha Toshiba, Kawasaki, Japan

[21] Appl. No.: 181,526

[22] Filed: Apr. 14, 1988

[30] Foreign Application Priority Data

Apr. 15, 1987 [JP] Japan .................................. 62-92290

[51] Int. Cl.⁵ ..................... H01L 39/02; H01L 23/16; H01L 23/48
[52] U.S. Cl. ......................................... 357/80; 357/75; 357/68; 357/71
[58] Field of Search ...................... 357/75, 80, 71, 68

[56] References Cited
U.S. PATENT DOCUMENTS 4,731,645 3/1988 Parmentier ........................ 357/80

FOREIGN PATENT DOCUMENTS 58-209133 12/1983 Japan .

Primary Examiner—Mark Prenty
Attorney, Agent, or Firm—Cushman, Darby & Cushman

[57] ABSTRACT

Plural semiconductor elements are buried into an insulating substrate, and top surfaces of semiconductor elements and the substrate are in a same plane. A photosensitive dry film is covered on surfaces of the substrate and semiconductor elements. The photosensitive dry film has openings corresponding to electrodes of semiconductor elements, and conductors are filled in openings of the photosensitive dry film. The device has the multi-layer wiring construction without damaging to semiconductor elements arranged on the substrate.

9 Claims, 1 Drawing Sheet

ELECTRONIC CIRCUIT DEVICE AND METHOD OF MANUFACTURING SAME

BACKGROUND OF THE INVENTION

1. Field of the Invention

This invention relates generally to an electronic circuit device and a method of manufacturing same in which plural semiconductor elements are mutually connected using multi-layer wiring. More particularly, the invention relates to an electronic circuit device and method of manufacturing same in which multi-layer wiring is formed after arranging the semiconductor elements on a substrate.

2. Description of the Prior Art

Typical methods of forming wiring patterns are well known including: (1) applying a copper foil on a glass-epoxy substrate and etching the copper foil to form, for example, a printed circuit, (2) forming a conductive layer and an insulating layer on the substrate using vacuum evaporation or sputtering, and thereafter forming a circuit pattern using an etching process, (3) screen printing using a thick film paste, and the like.

When these conventional technologies are utilized to interconnect plural semiconductor elements on a substrate, the semiconductor elements are disposed on the substrate on which the wiring patterns have already been formed. Thereafter, a wire-bonding method is employed to connect the semiconductor elements to the wiring pattern. It has also been known to bury plural semiconductor elements into a resin substrate so that electrodes for the semiconductor elements are exposed on the same plane as the surface of the resin substrate. Thereafter, semiconductor elements are directly connected by wiring patterns. This method has an advantage of forming a thinner construction as a whole, because wire bonding is not necessary.

However, if above methods (1) through (3) are used to form wiring patterns, there are the following problems because the wiring patterns are formed on the substrate on which the semiconductor elements are already arranged. Above methods (1) and (2) need a metal etching process. As a result, the etchant can damage the semiconductor elements. Furthermore, since the resulting structure must be cleaned to eliminate residue, the manufacturing process becomes complex. Method (3) needs a high temperature curing process after thick paste printing. As a result, the high temperature may damage the semiconductor elements. These problems become more acute as the number of wiring layers increases.

Thus, in these conventional technologies, the semiconductor elements may be damaged from the etchant and the high temperature as the semiconductor elements are interconnected using multilayer wiring after the semiconductor elements are arranged on the substrate.

SUMMARY OF THE INVENTION

Accordingly, one object of this invention is to provide an electronic circuit device and a method of manufacturing an electronic circuit device with multi-layer wiring without damaging semiconductor elements arranged on a substrate.

Briefly, in accordance with an aspect of this invention, a first photosensitive dry film is laminated on the surface of the substrate on which plural semiconductor elements are arranged.

Next, this first photosensitive dry film is exposed and developed, opening holes to electrodes of the semiconductor elements. An electric conductive material is filled in the openings. Thereafter, first wiring patterns are formed on the first photosensitive dry film. A photoresist agent is applied on the first photosensitive dry film and the first wiring patterns. Then a second photosensitive dry film is laminated thereon. The second photosensitive dry film and photoresist layer are exposed and developed. As a result, openings are formed therein.

Next, an electric conductive material filled in the openings. Thereafter, second wiring patterns are formed on the second photosensitive dry film.

The photoresist agent may be a liquid coated on the assembly and may be of the same composition as the dry film layers. Also the conductive material applied may be a resin paste including metal powder and may be applied by screen printing.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
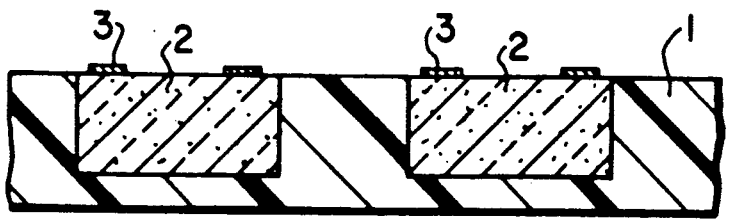
FIGS. 1 through 5 are cross-sectional diagrams illustrating a manufacturing process of an electronic circuit device according to one embodiment of the present invention.

Referring now to the drawings, wherein like reference numerals designate identical or corresponding parts throughout the several views, plural semiconductor elements 2, e.g., IC chips, are buried in a resin substrate 1. The surface of resin substrate 1 and the surface of electrode 3 (input/output pads) of semiconductor elements 2 lie in the same plane. Resin substrate 1 is a thermoplastic resin, and preferable materials are a vinyl chloride resin, a polycarbonate resin, a polysulfone resin, a polyethyleneterephthalate resin, a polyethersulfone resin, a polyetherketon resin, and the like.

Semiconductor elements 2 are inserted into holes in substrate 1, which holes are larger than semiconductor elements 2. Thereafter, semiconductor elements 2 are fixed into the holes of resin substrate 1 by shrinking the thermoplastic resin using a thermal press process.

Figure 2:
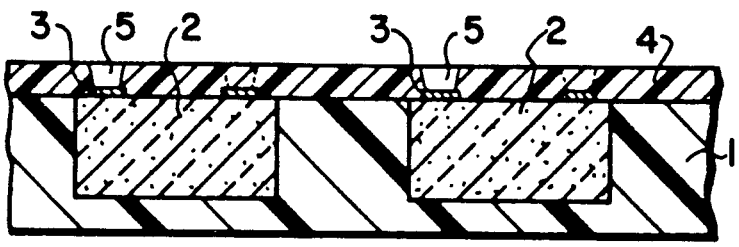

Next, in FIG. 2, an acrylic first photosensitive dry film 4 is thermally-laminated at a temperature of 80° C. on surfaces of resin substrate 1 and semiconductor elements 2. This photosensitive dry film 4 is exposed and developed, and openings 5 are formed on corresponding portions to electrodes 3 of semiconductor elements 2.

Figure 3:
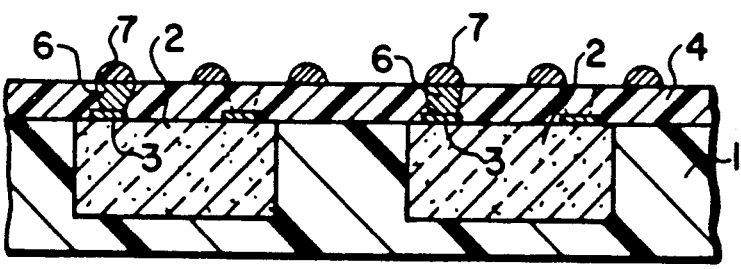

In FIG. 3, electric conductive resin paste is filled into openings 5 of photosensitive dry film 4 and hardened at 80° C. As a result, first via fill conductors 6 are formed. The electric conductive resin paste is formed to include metal powder, e.g., copper, into the resin, e.g., an epoxy resin, a phenol resin or a polyester resin. Thereafter, first wiring patterns 7 are formed on first photosensitive dry film 4 by screen-printing the same electric conductive resin paste and thermal-hardening at 80° C. As a result, electrodes 3 of semiconductor elements 2 and first wiring patterns 7 are electrically connected by first via fill conductors 6.

Figure 4:
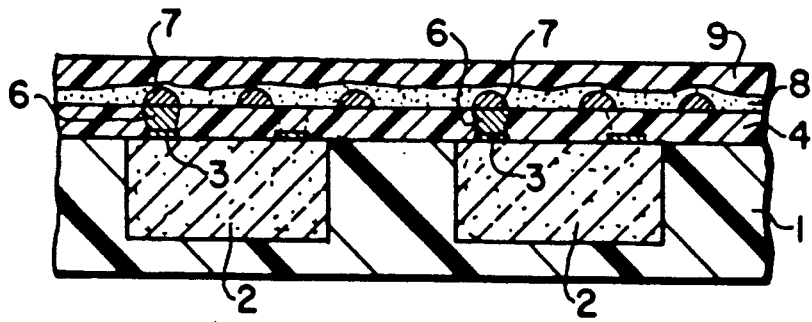

Next, in FIG. 4, a liquid photoresist layer 8 having a thickness of 2–5μ is coated by a spinning coat method on first photosensitive dry film 4 and first wiring patterns 7 and is dried. The composition of liquid photoresist layer 8 is preferably the same as the composition of first photosensitive dry film 4, e.g., an acrylic material. Thereafter, second photosensitive dry film 9, preferably of the same composition, is thermally-laminated thereon.

Figure 5:
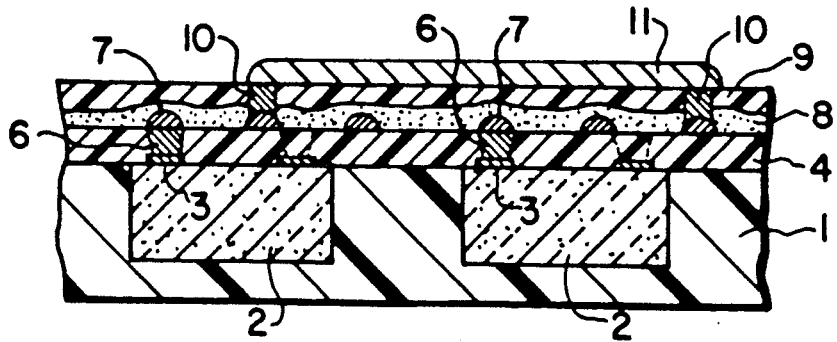

In FIG. 5, second photosensitive dry film 9 and photoresist layer 8 are exposed and developed, forming openings. Thereafter, the openings are filled with electric conductive resin paste and thermally-hardened to form second via fill conductors 10. Second wiring patterns 11 are formed by screen printing of the same electric conductive resin paste. As a result, the electronic circuit device is formed with a double layer wiring pattern on plural semiconductor elements 2.

If second photosensitive dry film 9 is directly laminated on first photosensitive dry film 4 without photoresist layer 8, air bubbles are unavoidably formed between second photosensitive dry film 9 and first wiring patterns 7, because the thickness of first wiring patterns 7 is 10–20μ. As a result, the developer enters the air bubbles during exposure and developing. Therefore, second photosensitive dry film 9 is apt to peel off from the surface of first photosensitive dry film 4, and it will become difficult to form second wiring patterns 11.

Therefore, in this invention, second photosensitive dry film 9 is thermally-laminated onto photoresist layer 8. Since photoresist layer 8 reduces the unevenness in the surface to which film 9 is applied, formation of air bubbles can be prevented. It becomes easy to form second wiring patterns 11 so that the unevenness of the surface is eased.

If there is only photoresist layer 8 without second photosensitive dry film 9, it is difficult to cover completely the surfaces of first wiring patterns 7. Since photoresist layer 8 cannot be coated thicker than 2–5μ, pin holes are formed in photoresist layer 8. Pin holes can cause an electric short between first and second wiring patterns 7 and 11. Accordingly, the photoresist layer cannot alone successfully insulate the wiring patterns. This problem may also be solved by forming photoresist layer 8 and second photosensitive dry film 9.

The temperature at which the photosensitive dry films are laminated and the electric conductive resin paste is hardedned is about 80° C. This is significantly lower than the curing temperature (about 900° C.) of the thick layer paste. As a result, semiconductor elements are not damaged.

There are no metal etching processes in this invention because the wiring patterns are formed by screen printing. Therefore, semiconductor elements are not damaged and no residue is generated as is typical of the metal etching process.

What is claimed is:

1. An electronic circuit device, comprising:
an insulating substrate;
a plurality of semiconductor elements formed in respective recesses of said insulating substrate, and electrodes formed on the semiconductor elements and in a same plane as a main surface of said insulating substrate;
a first photosensitive dry film on said main surface of the substrate and on said semiconductor elements, and having openings at locating corresponding to said electrodes of said semiconductor elements;
a plurality of first conductors, each filling in said openings of the first photosensitive dry film; and
first wiring patterns formed on the first photosensitive dry film and connected to the first conductors.

2. The electronic circuit device according to claim 1, wherein the plurality of semiconductor elements are buried in the insulating substrate.

3. A device as in claim 1, wherein said first wiring patterns are screen printed.

4. A device as in claim 3, further comprising a liquid photoresist layer which covers said first photosensitive dry film, said plurality of first conductors, and said first wiring patterns.

5. A device as in claim 4, further comprising a second photosensitive dry film which covers said liquid photoresist layer, and which is formed with at least one opening therein which includes a filling conductor therein in contact with one of said first conductors.

6. A device as in claim 1, further comprising a liquid photoresist layer which covers said first photosensitive dry film, said plurality of first conductors, and said first wiring patterns.

7. A device as in claim 6, further comprising a second photosensitive dry film which covers said first liquid photoresist layer, and formed with at least one opening therein adjacent one of said first conductors.

8. A device as in claim 7, further comprising at least one second conductor which fills in said at least one opening, and
second wiring patterns formed on the second photosensitive dry film and connected to at least one second conductor.

9. An electronic circuit device, comprising:
an insulating substrate;
a plurality of semiconductor elements formed in respective recesses of said insulating substrate, and electrodes formed on the substrate and in a same plane as a main surface of the substrate;
a first photosensitive dry film on said main surface of the substrate and on said semiconductor elements and having openings at locations corresponding to said electrodes of said semiconductor elements;
a plurality of first conductors each filling in said openings of the first photosensitive dry film;
first wiring patterns formed on the first photosensitive dry film and connected to the plurality of first conductors;
a liquid photoresist layer which covers said first photosensitive dry film, said plurality of first conductors, and said first wiring patterns;
a second photosensitive dry film which covers said liquid photoresist layer and which is formed with at least one opening therein adjacent one of said first conductors;
at least one second conductor which fills in said at least one opening; and
second wiring patterns formed on the second photosensitive dry film and connected to the at least one second conductor.

* * * * *